(12) United States Patent
Buhay et al.

(10) Patent No.: US 6,869,644 B2
(45) Date of Patent: Mar. 22, 2005

(54) METHOD OF MAKING COATED ARTICLES AND COATED ARTICLES MADE THEREBY

(75) Inventors: Harry Buhay, Allison Park, PA (US); James J. Finley, Pittsburgh, PA (US); James P. Thiel, Pittsburgh, PA (US); John P. Lehan, Pittsburgh, PA (US)

(73) Assignee: PPG Industries Ohio, Inc., Cleveland, OH (US)

( * ) Notice: Subject to any disclaimer, the term of this patent is extended or adjusted under 35 U.S.C. 154(b) by 440 days.

(21) Appl. No.: 10/007,382

(22) Filed: Oct. 22, 2001

(65) Prior Publication Data

US 2004/0106017 A1 Jun. 3, 2004

Related U.S. Application Data

(60) Provisional application No. 60/242,543, filed on Oct. 24, 2000.

(51) Int. Cl.[7] .............................. B05D 1/36; B05D 3/02; B05D 7/00
(52) U.S. Cl. ................................. 427/419.2; 427/376.2
(58) Field of Search ............................. 427/402, 419.1, 427/419.2, 376.1, 376.2, 162, 165

(56) References Cited

U.S. PATENT DOCUMENTS

| | | | |
|---|---|---|---|
| 3,459,526 A | 8/1969 | Stickel et al. | 65/289 |
| 3,476,540 A | 11/1969 | Ritter, Jr. et al. | 65/107 |
| 3,527,589 A | 9/1970 | Ritter, Jr. | 65/289 |
| 4,081,934 A | 4/1978 | Franz | 51/171 |
| 4,197,108 A | 4/1980 | Frank et al. | 65/273 |
| 4,265,650 A | 5/1981 | Reese et al. | 65/104 |
| 4,272,272 A | 6/1981 | Grubka | 65/1 |
| 4,395,432 A | 7/1983 | Rizzelli et al. | 427/34 |
| 4,504,109 A | 3/1985 | Taga et al. | 350/1.6 |
| 4,508,556 A | 4/1985 | Bennett et al. | 65/25.4 |
| 4,579,577 A | 4/1986 | Claassen | 65/273 |
| 4,610,771 A | 9/1986 | Gillery | 204/192.1 |
| 4,661,139 A | 4/1987 | Reese et al. | 65/106 |
| 4,716,086 A | 12/1987 | Gillery et al. | 428/630 |
| 4,735,488 A * | 4/1988 | Rancourt et al. | 359/586 |
| 4,786,563 A | 11/1988 | Gillery et al. | 428/630 |
| 4,806,220 A | 2/1989 | Finley | 204/192.27 |
| 4,820,902 A | 4/1989 | Gillery | 219/203 |
| 4,830,650 A | 5/1989 | Kelly | 65/106 |
| 4,834,857 A | 5/1989 | Gillery | 204/192.27 |
| 4,898,789 A | 2/1990 | Finley | 428/623 |
| 4,898,790 A | 2/1990 | Finley | 428/623 |
| 4,898,798 A | 2/1990 | Sugata et al. | 430/58 |
| 4,902,580 A | 2/1990 | Gillery | 428/623 |
| 4,948,677 A | 8/1990 | Gillery | 428/623 |
| 4,952,423 A | 8/1990 | Hirata et al. | 427/109 |
| 5,028,759 A | 7/1991 | Finley | 219/203 |
| 5,059,295 A | 10/1991 | Finley | 204/192.27 |
| 5,286,271 A | 2/1994 | Rueter et al. | 65/106 |
| 5,344,718 A | 9/1994 | Hartig et al. | 428/623 |
| 5,376,455 A | 12/1994 | Hartig et al. | 428/428 |
| 5,387,433 A * | 2/1995 | Balian et al. | 427/126.3 |
| 5,425,861 A | 6/1995 | Hartig et al. | 204/192.26 |
| 5,532,180 A | 7/1996 | den Boer et al. | 437/40 |
| 5,584,902 A | 12/1996 | Hartig et al. | 65/32.4 |
| 5,653,903 A | 8/1997 | Pinchok, Jr. et al. | 219/203 |
| 5,776,603 A | 7/1998 | Zagdoun et al. | 428/336 |
| 5,821,001 A | 10/1998 | Arbab et al. | 428/623 |
| 5,939,201 A | 8/1999 | Boire et al. | 428/432 |
| 6,010,602 A | 1/2000 | Arbab et al. | 204/192.27 |
| 6,048,621 A * | 4/2000 | Gallego et al. | 428/432 |
| 2002/0176988 A1 * | 11/2002 | Medwick et al. | 428/408 |

FOREIGN PATENT DOCUMENTS

| | | |
|---|---|---|
| EP | 0 500 445 | 8/1992 |
| EP | 0 712 815 | 5/1996 |
| EP | 0 823 407 | 2/1998 |
| GB | 2 302 102 | 1/1997 |
| GB | 2302102 | 1/1997 |

OTHER PUBLICATIONS

U.S. Appl. No. 09/512,852 filed Feb. 25, 2000.
U.S. Appl. No. 09/058,440 filed Apr. 9, 1998.
U.S. Provisional Patent Application No. 60/242,543 filed Oct. 24, 2000.

* cited by examiner

*Primary Examiner*—Shrive P. Beck
*Assistant Examiner*—William Phillip Fletcher, III
(74) *Attorney, Agent, or Firm*—Jacques B. Miles

(57) ABSTRACT

A method of making a coated substrate includes providing a substrate having a functional coating with a first emissivity value; depositing a coating material having a second emissivity value over at least a portion of the functional coating prior to heating to provide a coating stack having an emissivity value greater than the emissivity value of the functional coating; and heating the coated substrate.

10 Claims, 6 Drawing Sheets

METHOD OF MAKING COATED ARTICLES AND COATED ARTICLES MADE THEREBY

CROSS-REFERENCE TO RELATED APPLICATION

This application claims the benefits of U.S. Provisional Application Ser. No. 60/242,543 filed Oct. 24, 2000 entitled "Monolithic Automotive Transparency", which is herein incorporated by reference in its entirety.

BACKGROUND OF THE INVENTION

1. Field of the Invention

This invention relates generally to methods of making coated articles, e.g., coated automotive transparencies, and to the coated articles made thereby.

2. Description of the Currently Available Technology

It is known to reduce heat build-up in the interior of a vehicle by providing a laminated windshield having two glass plies with an infrared (IR) or ultraviolet (UV) attenuating solar control coating positioned between the plies to protect the solar control coating from mechanical and/or chemical damage. These conventional windshields are made by shaping and annealing two flat glass "blanks" (one of which has the solar control coating deposited thereon) to form two shaped, annealed glass plies and then securing the glass plies together with a plastic interlayer. Because conventional solar control coatings include metal layers that reflect heat, the glass blanks are positioned one on top of another during heating with the functional coating sandwiched between the glass blanks to prevent uneven heating and cooling, which can affect the final shape of the plies. Examples of laminated automotive windshields and methods of making the same are disclosed in U.S. Pat. Nos. 4,820,902; 5,028,759; and 5,653,903, which are herein incorporated by reference.

It would be advantageous to provide a solar control coating on other automotive transparencies, such as sidelights, back lights, sunroofs, moon roofs, etc. However, the processes of making laminated windshields are not easily adapted to making other types of laminated and/or non-laminated automotive transparencies. For example, conventional automotive sidelights are usually made from a single glass blank that is individually heated, shaped, and tempered to a desired curvature dictated by the dimensions of the vehicle opening into which the sidelight is to be installed. A problem posed in making sidelights not encountered when making windshields is the problem of individually heating glass blanks having a heat-reflecting solar control coating.

Additionally, if the sidelight is positioned such that the coating is on the surface of the sidelight facing away from the vehicle (the outer surface), the coating is susceptible to mechanical damage from objects hitting the coating and to chemical damage from acid rain or car wash detergents. If the coating is on the surface of the sidelight facing the interior of the vehicle (the inner surface), the coating is susceptible to mechanical damage from being touched by the vehicle occupants or from being rolled up and down in the window channel, and to chemical damage from contact with conventional glass cleaners. Additionally, if the coating is a low emissivity coating it can promote a greenhouse effect trapping heat inside the vehicle.

While it is known to reduce chemical damage or corrosion to a coating by overcoating with a chemically resistant material, these overcoats are typically applied as thin as possible so as not to adversely affect the aesthetics of the underlying coating and so as not to significantly increase the emissivity of the underlying coating. Such thin overcoats do not meet the durability requirements for shipping, processing, or end use of conventional coated automotive transparencies, which are easily damaged and continuously exposed to the environment. Additionally, such thin overcoats would not alleviate the greenhouse effect problem discussed above. Examples of conventional overcoats are disclosed in U.S. Pat. Nos. 4,716,086; 4,786,563; 5,425,861; 5,344,718; 5,376,455; 5,584,902; and 5,532,180.

Therefore, it would be advantageous to provide a method of making an article, e.g., a laminated or non-laminated automotive transparency, having a functional coating that reduces or eliminates at least some of the problems discussed above.

SUMMARY OF THE INVENTION

A method is provided for making a coated substrate. The method includes providing a substrate having a functional coating with a first emissivity value; depositing a coating material having a second emissivity value over at least a portion of the functional coating prior to heating to provide a coating stack having an emissivity value greater than the emissivity value of the functional coating; and heating the coated substrate. The invention can be practiced for making both laminated and single ply articles. For laminated articles, the protective coating can generally be thinner than for single ply articles. The protective coating of the invention not only provides increased protection from mechanical and/or chemical damage to the underlying functional coating but also provides improved heating characteristics when heating and/or shaping the coated substrate.

A method of making a laminated article in the practice of the invention includes providing a first substrate having a major surface; applying a functional coating having an emissivity value over at least a portion of the first substrate major surface; applying a protective coating over at least a portion of the functional coating to form a coating stack having an emissivity value greater than the emissivity value of the functional coating; providing a second substrate; heating the first and second substrates individually to desired shapes; and laminating the first and second substrates together with an interlayer.

A method is also provided for making a coated article in which a substrate with a functional coating is heated in a furnace and cooled. In the practice of the invention, an emissivity increasing protective coating material is applied onto at least a portion of the functional coating to increase the emissivity of the coated substrate prior to heating.

Another method of making a coated article in the practice of the invention includes providing a coating having a predetermined solar infrared reflectance and a predetermined emissivity; and altering the coating such that the emissivity increases but the solar infrared reflectance remains substantially the same.

An article of the invention includes a substrate, a functional coating deposited over at least a portion of the substrate, and a protective coating deposited over the functional coating. The functional coating and the protective coating define a coating stack and the protective coating provides the coating stack with an emissivity higher than that of the functional coating alone.

A laminated article of the invention includes a first ply having a first major surface, a functional coating deposited over at least a portion of the first major surface and having an emissivity value, and a protective coating deposited over at least a portion of the functional coating to form a coating stack having an emissivity, with the protective coating configured to increase the emissivity of the coating stack over the emissivity of the functional coating alone. The article further includes a second ply, and an interlayer located between the first and second plies.

A monolithic article, e.g., an automotive transparency, of the invention includes a substrate, e.g., a glass substrate, and a functional coating deposited over at least a portion of the substrate. A protective coating is deposited over the functional coating to form a coating stack. The protective coating can include aluminum oxide, silicon oxide, or mixtures thereof and can have a thickness of 1 micron to 5 microns. The protective coating can provide the coating stack preferably with an emissivity of at least 0.5.

DESCRIPTION OF THE PREFERRED EMBODIMENTS

Figure 1:
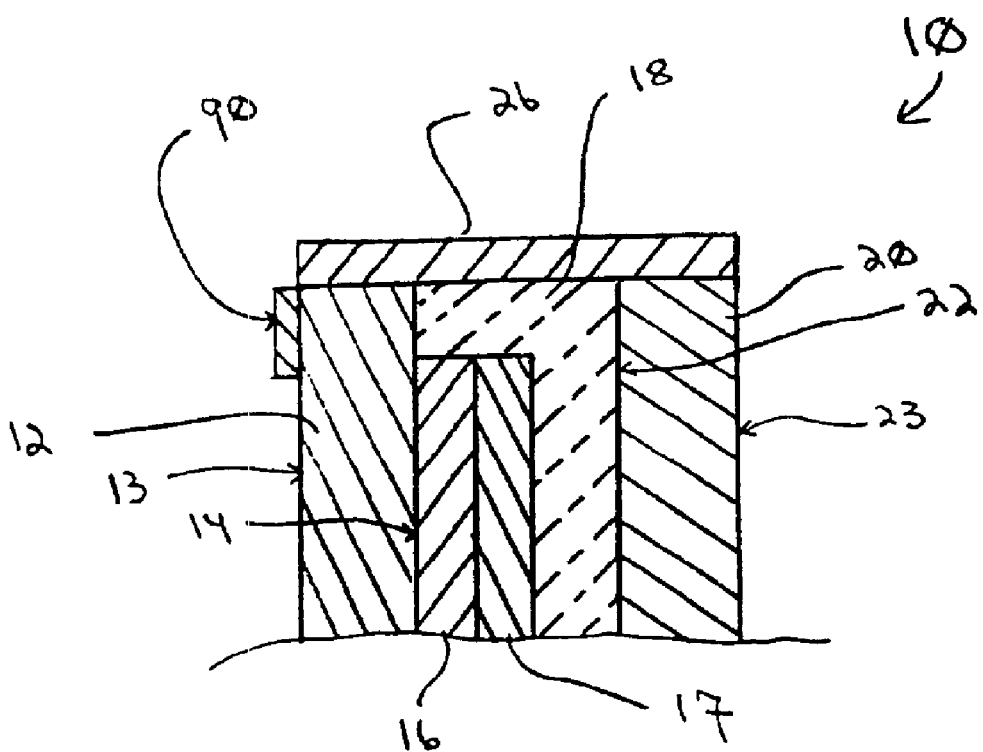
FIG. 1 is a side, sectional view (not to scale) of an edge portion of a laminated automotive transparency, e.g., a sidelight, incorporating features of the invention.

As used herein, spatial or directional terms, such as "left", "right", "inner", "outer", "above", "below", "top", "bottom", and the like, relate to the invention as it is shown in the drawing figures. However, it is to be understood that the invention may assume various alternative orientations and, accordingly, such terms are not to be considered as limiting. Further, as used herein, all numbers expressing dimensions, physical characteristics, processing parameters, quantities of ingredients, reaction conditions, and the like, used in the specification and claims are to be understood as being modified in all instances by the term "about". Accordingly, unless indicated to the contrary, the numerical values set forth in the following specification and claims may vary depending upon the desired properties sought to be obtained by the present invention. At the very least, and not as an attempt to limit the application of the doctrine of equivalents to the scope of the claims, each numerical value should at least be construed in light of the number of reported significant digits and by applying ordinary rounding techniques. Moreover, all ranges disclosed herein are to be understood to encompass the beginning and ending range values and any and all subranges subsumed therein. For example, a stated range of "1 to 10" should be considered to include any and all subranges between (and inclusive of) the minimum value of 1 and the maximum value of 10; that is, all subranges beginning with a minimum value of 1 or more and ending with a maximum value of 10 or less, e.g., 5.5 to 10. The terms "flat" or "substantially flat" substrate refer to a substrate that is substantially planar in form; that is, a substrate lying primarily in a single geometric plane, which substrate, as would be understood by one skilled in the art, can include slight bends, projections, or depressions therein. Further, as used herein, the terms "deposited over", "applied over", or "provided over" mean deposited or provided on but not necessarily in surface contact with. For example, a coating "deposited over" a substrate does not preclude the presence of one or more other coating films of the same or different composition located between the deposited coating and the substrate.

As will be appreciated from the following discussion, the protective coating of the invention can be utilized in making both laminated and non-laminated, e.g., single ply, articles. For use with laminated articles, the protective coating can usually be thinner than for non-laminated articles. The structural components and a method of making an exemplary laminated article of the invention will first be described and then an exemplary monolithic article of the invention will be described. By "monolithic" is meant having a single structural substrate or primary ply, e.g., a glass ply. By "primary ply" is meant a primary support or structural member. In the following discussion, the exemplary article (whether laminated or monolithic) is described as an automotive sidelight. However, the invention is not limited to automotive sidelights but may be used with any articles, such as but not limited to, insulating glass units, residential or commercial laminated windows (e.g., skylights), or transparencies for land, air, space, above water and underwater vehicles, e.g. windshields, backlights, sun or moon roofs, just to name a few articles.

FIG. 1 illustrates a laminated sidelight 10 incorporating features of the invention. The laminated sidelight 10 includes a first blank or ply 12 having an outer major surface 13 and an inner major surface 14. A functional coating 16 is deposited over at least a portion, preferably all, of the inner major surface 14. As will be described in more detail, a protective coating 17 of the invention is deposited over at least a portion, preferably all, of the functional coating 16 and aids not only in increasing mechanical and chemical durability but also provides improved heating characteristics for bending and/or shaping the blank on which it is deposited. An interlayer 18 is located between the first ply 12 and a second blank or ply 20 having an inner major surface 22 and an outer major surface 23. In one embodiment, the outer major surface 23 faces the exterior of the vehicle and the outer major surface 13 faces the interior of the vehicle. A conventional edge sealant 26 can be applied to the perimeter of the laminated sidelight 10 during and/or after lamination in any conventional manner. A decorative band 90, e.g., an opaque, translucent or colored band, such as a ceramic band, may be provided on a surface of at least one of the plies 12 and 20, for example, around the perimeter of one of the inner or outer major surfaces.

In the broad practice of the invention, the first ply 12 and second ply 20 may be of any desired material having any desired characteristics, such as opaque, translucent, transparent or substantially transparent substrates. By "substantially transparent" is meant having a visible light transmittance of 60% or greater. By "translucent" is meant having a visible light transmittance of greater than 0% to less than 60%. By "opaque" is meant having a visible light transmittance of 0%. The plies 12 and 20 may be of the same or different materials. Examples of suitable substrates include, but are not limited to, plastic substrates (such as polyacrylates, polycarbonates, and polyethyleneterephthalate (PET)); metal substrates; enameled or ceramic substrates; glass substrates; or mixtures or combinations thereof. The glass can be, for example, conventional untinted soda-lime-silica glass, i.e. "clear glass", or can be tinted or otherwise colored glass, borosilicate glass, leaded glass, tempered, untempered, annealed, or heat strengthened glass. The glass may be of any type, such as conventional float glass, flat glass, or a float glass ribbon, and may be of any composition having any optical properties, e.g., any value of visible transmission, ultraviolet transmission, infrared transmission, and/or total solar energy transmission. Types of glass suitable for the practice of the invention are described, for example but not to be considered as limiting, in U.S. Pat. Nos. 4,746,347; 4,792,536; 5,240,886; 5,385,872; and 5,393,593. Although the invention is not limited by the thickness of the substrate, for use in forming a laminated automotive sidelight the first and second plies 12, 20 can be less than about 3.0 mm thick, such as less than about 2.5 mm thick, such as in the thickness range of about 1.0 mm to about 2.1 mm. As described below, for monolithic articles the substrate is usually thicker.

The functional coating 16 may be of any desired type. As used herein, the term "functional coating" refers to a coating which modifies one or more physical properties of the substrate on which it is deposited, e.g., optical, thermal, chemical or mechanical properties, and is not intended to be entirely removed from the substrate during subsequent processing. The functional coating 16 may have one or more functional coating films of the same or different composition or functionality. As used herein, the terms "layer" or "film" refer to a coating region of a desired or selected coating composition. A "coating" or "coating stack" is composed of one or more "films" or "layers".

The functional coating 16 may be an electrically conductive coating, such as, for example, an electrically conductive coating used to make heatable windows as disclosed in U.S. Pat. Nos. 5,653,903 and 5,028,759, or a single-film or multi-film coating used as an antenna. Likewise, the functional coating 16 may be a solar control coating. As used herein, the term "solar control coating" refers to a coating comprised of one or more layers or films which affect the solar properties of the coated article, such as but not limited to the amount of solar radiation, for example, visible, infrared, or ultraviolet radiation incident on and/or passing through the coated article, infrared or ultraviolet absorption or reflection, shading coefficient, emissivity, etc. The solar control coating may block, absorb or filter selected portions of the solar spectrum, such as but not limited to the IR, UV, and/or visible spectrums. Examples of solar control coatings that may be used in the practice of the invention are found, for example, in U.S. Pat. Nos. 4,898,789; 5,821,001; 4,716,086; 4,610,771; 4,902,580; 4,716,086; 4,806,220; 4,898,790; 4,834,857; 4,948,677; 5,059,295; and 5,028,759, and also in U.S. patent application Ser. No. 09/058,440.

The functional coating 16 can also be a low emissivity coating that allows visible wavelength energy, e.g., 400 nm to 780 nm, to be transmitted through the coating but reflects longer-wavelength solar infrared energy. By "low emissivity" is meant emissivity less than 0.4, preferably less than 0.3, more preferably less than 0.2, even more preferably less than 0.1, and still more preferably less than or equal to 0.05.

Examples of low emissivity coatings are found, for example, in U.S. Pat. Nos. 4,952,423 and 4,504,109 and British reference GB 2,302,102. The functional coating 16 may be a single layer coating or multiple layer coating and may include one or more metals, non-metals, semi-metals, semiconductors, and/or alloys, compounds, composites, combinations, or blends thereof. For example, the functional coating 16 may be a single layer metal oxide coating, a multiple layer metal oxide coating, a non-metal oxide coating, a metallic nitride or oxynitride coating, or a non-metallic nitride or oxynitride coating, or a multiple layer coating.

Examples of suitable functional coatings for use with the invention are commercially available from PPG Industries, Inc. of Pittsburgh, Pa. under the SUNGATE® and SOLARBAN® families of coatings. Such functional coatings typically include one or more anti-reflective coating films comprising dielectric or anti-reflective materials, such as metal oxides or oxides of metal alloys, which are preferably transparent or substantially transparent to visible light. The functional coating may also include one or more infrared reflective films comprising a reflective metal, e.g., a noble metal such as gold, copper or silver, or combinations or alloys thereof, and may further comprise a primer film or barrier film, such as titanium, as is known in the art, located over and/or under the metal reflective layer. The functional coating may have any desired number of infrared reflective films, such as 1 or more silver layers, e.g., 2 or more silver layers, e.g., 3 or more silver layers.

Although not limiting to the invention, the functional coating 16 can be positioned on one of the inner major surfaces 14, 22 of the laminate to make the coating 16 less susceptible to environmental and mechanical wear than if on an outer surface of the laminate. However the functional coating 16 could also be provided on one or both of the outer major surfaces 13 or 23. As shown in FIG. 1, a portion of the coating 16, e.g., about a 1 mm to 20 mm, such as 2 mm to 4 mm wide area around the outer perimeter of the coated region, can be removed or deleted in any conventional manner, e.g., by grinding prior to lamination or masking during coating to minimize damage to the coating 16 at the edge of the laminate by weathering or environmental action during use. In addition, deletion could be done for functional performance, e.g., for antennas, heated windshields, or to improve radio-wave transmission, and the deleted portion can be of any size. For aesthetic purposes, a colored, opaque, or translucent band 90 may be provided over any surface of the plies or the coatings, for example over one or both surfaces of one or both of the plies, e.g., around the perimeter of the outer major surface 13, to hide the deleted portion. The band 90 can be made of a ceramic material and may be fired onto the outer major surface 13 in any conventional manner.

The protective coating 17 of the invention is deposited over at least a portion, preferably all, of the outer surface of the functional coating 16. The protective coating 17, among other things, raises the emissivity of the coating stack (e.g., the functional coating plus protective coating) to be greater than the emissivity of the functional coating 16 alone. By way of example, if the functional coating 16 has an emissivity value of 0.2, the addition of the protective coating 17 raises the emissivity value of the resultant coating stack to an emissivity of greater than 0.2. In one embodiment, the protective coating increases the emissivity of the resulting coating stack by a factor of two or more over the emissivity of the functional coating (i.e., if the emissivity of the functional coating is 0.05, the addition of the protective layer increases the emissivity of the resulting coating stack to 0.1 or more), such as by a factor of five or more, e.g., by a factor of ten or more, e.g., by a factor of twenty or more. In another embodiment of the invention, the protective coating 17 raises the emissivity of the resulting coating stack to substantially the same as the emissivity of the substrate on which the coating is deposited, e.g., within 0.2 of the emissivity of the substrate. For example, if the substrate is glass having an emissivity of about 0.84, the protective coating 17 preferably provides a coating stack having an emissivity in the range of 0.3 to 0.9, such as greater than 0.3, e.g., greater than 0.5, e.g., greater than 0.6, e.g., 0.5 to 0.9. As will be described below, increasing the emissivity of the functional coating 16 by deposition of the protective coating 17 improves the heating and cooling characteristics of the coated ply 12 during processing. The protective coating 17 also protects the functional coating 16 from mechanical and chemical attack during handling, storage, transport, and processing.

In one embodiment, the protective coating 17 preferably has an index of refraction that is about the same as that of the ply 12 to which it is laminated. For example, if the ply 12 is glass having an index of refraction of 1.5, the protective coating 17 preferably has an index of refraction of less than 2, such as 1.3 to 1.8, e.g., 1.5±0.2.

The protective coating 17 can be of any desired thickness. In one exemplary laminated article embodiment, the protective coating 17 has a thickness of 500 Å to 50,000 Å, e.g., 500 Å to 10,000 Å. Further, the protective coating 17 need not be of uniform thickness across the surface of the functional coating 17 but may have high and low spots or areas.

The protective coating 17 can be of any desired material. In one exemplary embodiment, the protective coating 17 can include one or more metal oxide materials, such as but not limited to, aluminum oxide, silicon oxide, or mixtures thereof. For example, the protective coating can be in the range of 35 weight percent (wt. %) to 100 wt. % alumina and 65 wt. % to 0 wt. % silica, e.g., 70 wt. % to 90 wt. % alumina and 10 wt. % to 30 wt. % silica, e.g., 75 wt. % to 85 wt. % alumina and 15 wt. % to 25 wt. % of silica, e.g., 88 wt. % alumina and 12 wt. % silica, e.g., 65 wt. % to 75 wt. % alumina and 25 wt. % to 35 wt. % silica, e.g., 70 wt. % alumina and 30 wt. % silica. Other materials, such as aluminum, chromium, hafnium, yttrium, nickel, boron, phosphorous, titanium, zirconium, and oxides thereof, can be present to affect the refractive index of the protective coating.

The interlayer 18 can be any material that is used to adhere the plies together, such as but not limited to a plastic material, such as polyvinyl butyral or a similar material and can have any desired thickness, e.g., in the range of 0.50 mm to about 0.80 mm, such as 0.76 mm.

An exemplary method of making a laminated sidelight 10 utilizing features of the invention will now be discussed.

A first substrate and a second substrate are provided. The first and second substrates can be flat glass blanks having a thickness of about 1.0 mm to 6.0 mm, typically about 1.0 mm to about 3.0 mm, such as about 1.5 mm to about 2.3 mm. A functional coating 16 is applied over at least a portion of a major surface of the first glass substrate, for example, the major surface 14. The functional coating 16 may be deposited in any conventional manner, such as but not limited to, magnetron sputter vapor deposition (MSVD), pyrolytic deposition such as chemical vapor deposition (CVD), spray pyrolysis, atmospheric pressure CVD (APCVD), low-pressure CVD (LPCVD), plasma-enhanced CVD (PEVCD), plasma assisted CVD (PACVD), or thermal evaporation by resistive or electron-beam heating, cathodic arc deposition, plasma spray deposition, wet chemical deposition (e.g., sol-gel, mirror silvering, etc.), or any other desired manner. For example, the functional coating 16 can be deposited over the first substrate after the first substrate is cut to a desired dimension. Alternatively, the functional coating 16 can be applied over a glass sheet before it is processed and/or over a float glass ribbon supported on a bath of molten metal, e.g., tin, in a conventional float chamber by one or more conventional CVD coaters positioned in the float chamber. Upon exiting the float chamber, the ribbon can be cut to form the coated first substrate.

Alternatively, the functional coating 16 can be deposited over the float glass ribbon after the ribbon exits the float chamber. For example, U.S. Pat. Nos. 4,584,206, 4,900,110, and 5,714,199, herein incorporated by reference, disclose methods and apparatus for depositing a metal-containing film on the bottom surface of a glass ribbon. Such a known apparatus can be located downstream of a molten tin bath in the float glass process to provide a functional coating on the bottom of the glass ribbon, i.e., the side of the ribbon that was in contact with the molten metal. Still further, the functional coating 16 can be applied over the first substrate by MSVD after the substrate has been cut to a desired dimension.

A protective coating 17 of the invention is deposited over at least a portion of the functional coating 16. The protective coating 17 provides several processing advantages in making the laminated article. For example, the protective coating 17 protects the functional coating 16 from mechanical and/or chemical attack during handling, transport, storage, and processing. Additionally, as described below, the protective coating 17 facilitates heating and cooling of the functionally coated blank by increasing the emissivity of the resulting coating stack. While topcoats have been applied onto functional coatings in the past to help protect the functional coating from chemical and mechanical attack during processing, these topcoats were made as thin as possible so as not to impact upon the aesthetic or solar control properties of the functional coating, such as the coating emissivity. Conversely, in the present invention, the protective coating 17 is made sufficiently thick so as to raise the emissivity of the coating stack. Further, by substantially matching the index of refraction of the protective coating 17 to that of the substrate to which it is laminated, there is little or no adverse impact by the protective coating 17 upon the aesthetic characteristics of the functional coating 16 after lamination.

If the functional coating 16 is a low emissivity coating having one or more infrared reflecting metal layers, the addition of the protective coating 17 to raise the emissivity of the coating stack reduces the thermal infrared reflecting characteristics of the functional coating 16. However, the coating stack remains solar infrared reflective.

The protective coating may be deposited in any conventional manner, such as but not limited to those described above for applying the functional coating, e.g., in-bath or out-of-bath CVD, MSVD, or sol-gel, just to name a few. For example, the substrate with the functional coating can be directed to a conventional MSVD coating apparatus having one or more metal electrodes, e.g., cathodes, that can be sputtered in an oxygen-containing atmosphere to form a metal oxide protective coating. The MSVD apparatus can include one or more cathodes of aluminum, silicon, or mixtures or alloys of aluminum or silicon. The cathodes can be for example, 35 wt. % to 100 wt. % aluminum and 0 wt. % to 65 wt. % silicon, e.g., 50 wt. % to 80 wt. % aluminum and 20 wt. % to 50 wt. % silicon, e.g., 70 wt. % aluminum and 30 wt. % silicon. Additionally, other materials or dopants, such as aluminum, chromium, hafnium, yttrium, nickel, boron, phosphorous, titanium, or zirconium, can also be present to facilitate sputtering of the cathode(s) and/or to affect the refractive index or durability of the resultant coating. The protective coating 17 is applied in a sufficient amount or to a sufficient thickness to raise the emissivity of the coating stack over that of just the functional coating alone. In one embodiment, the protective coating can be applied to a thickness of 500 Å to 50,000 Å and/or to raise the emissivity of the coating stack to greater than or equal to about 0.3, e.g., greater than or equal to 0.4, e.g., greater than or equal to 0.5.

The functional coating 16 and/or protective coating 17 can be applied to the flat substrate or to the substrate after the substrate has been bent and shaped to a desired contour.

The coated first substrate and uncoated second substrate can be cut to provide a first, coated blank or ply and a second, uncoated blank or ply, respectively, each having a desired shape and desired dimensions. The coated and uncoated plies are seamed, washed, bent, and shaped to a desired contour to form the first and second plies 12 and 20, respectively, to be laminated. As can be appreciated by one of ordinary skill in the art, the overall shapes of the coated and uncoated blanks and plies depend upon the particular vehicle into which they will be incorporated, since the final shape of a sidelight differs between different automotive manufacturers.

Figure 2:
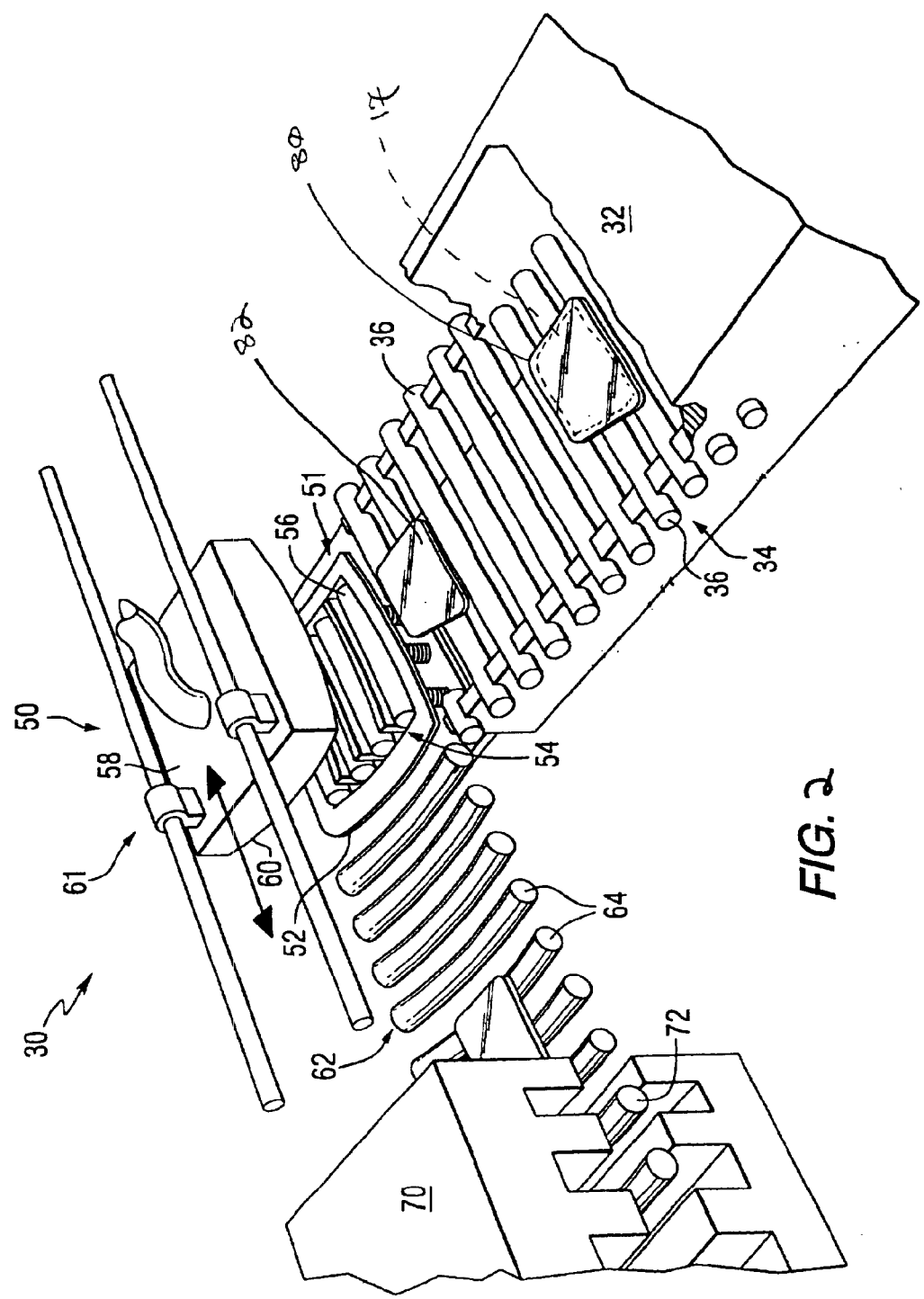
FIG. 2 is a perspective, partially broken view of an apparatus (with portions removed for clarity) for producing glass blanks G (coated or uncoated) in the practice of the invention.

The coated and uncoated blanks can be shaped using any desired process. For example, the blanks can be shaped using the "RPR" process disclosed in U.S. Pat. No. 5,286,271 or the modified RPR process disclosed in U.S. patent application Ser. No. 09/512,852, which patent and patent application are herein incorporated by reference. FIG. 2 shows an additional RPR apparatus 30 suitable for the practice of the invention and includes a furnace 32, e.g., a radiant heat furnace or tunnel Lehr, having a furnace conveyor 34 comprised of a plurality of spaced furnace conveyor rolls 36. Heaters, such as radiant heater coils, are positioned above and/or below the furnace conveyor 34 along the length of the furnace 32 and can be controlled to form heating zones of different temperature along the length of the furnace 32.

A shaping station 50 is located adjacent the discharge end of the furnace 32 and includes a lower mold 51 having a vertically movable flexible ring 52 and a shaping station conveyor 54 having a plurality of rolls 56. An upper vacuum mold 58 having a removable or reconfigurable shaping surface 60 of a predetermined shape is located above the lower mold 51. The vacuum mold 58 is movable via a shuttle arrangement 61.

A transfer station 62 having a plurality of shaped transfer rolls 64 is located adjacent a discharge end of the shaping station 50. The transfer rolls 64 preferably have a transverse elevational curvature corresponding substantially to the transverse curvature of the shaping surface 60.

A tempering or cooling station 70 is located adjacent a discharge end of the transfer station 62 and includes a plurality of rolls 72 to move the blanks through the station 70 for cooling, tempering, and/or heat strengthening. The rolls 72 have a transverse elevational curvature substantially the same as that of the transfer rolls 64.

In the past, heating functionally coated blanks presented difficulties due to the heat reflectance of the functional coating 16, which caused uneven heating of the coated and uncoated sides of the blank. U.S. patent application Ser. No. 09/512,852 discloses a method of overcoming this problem by modifying the RPR heating process to supply heat primarily toward the non-functionally coated surface of the blank. In the present invention, this problem is addressed by deposition of the emissivity increasing protective coating 17, which allows the same or substantially the same heating process to be used both for the functionally coated and non-functionally coated blanks.

As shown in FIG. 2, the first blank 80 with the coating stack (e.g., functional coating 16 and protective coating 17) and the non-functionally coated second blank 82 can be individually heated, shaped, and cooled prior to lamination. By "individually heated" is meant that the blanks are not stacked one on top of the other during heating. In one embodiment, the first blank 80 is placed on the furnace conveyor 34 with the protective coating 17 facing downwardly, i.e., in contact with the furnace conveyor rolls 36, during the heating process. The presence of the higher emissivity protective coating 17 reduces the problem of heat reflectance by the metal layers of the functional coating 16 and promotes more even heating of the coated and uncoated sides of the first blank 80. This helps prevent curling of the first blank 80 common in prior heating processes. In one exemplary embodiment, the blanks are heated to a temperature of about 640° C. to 704° C. during a period of about 10 mins to 30 mins.

At the end of the furnace 32, the softened glass blanks, whether coated 80 or non-coated 82, are moved from the furnace 32 to the shaping station 50 and onto the lower mold 51. The lower mold 51 moves upwardly, lifting the glass blank to press the heat-softened glass blank against the shaping surface 60 of the upper mold 58 to conform the glass blank to the shape, e.g., curvature, of the shaping surface 60. The upper surface of the glass blank is in contact with the shaping surface 60 of the upper mold 58 and is held in place by vacuum.

The shuttle arrangement 61 is actuated to move the upper vacuum mold 58 from the shaping station 50 to the transfer station 62, where the vacuum is discontinued to release the shaped glass blank onto the curved transfer rolls 64. The transfer rolls 64 move the shaped glass blank onto the rolls 72 and into the cooling station 70 for tempering or heat strengthening in any convenient manner. In the cooling station 70, air is directed from above and below the shaped glass blanks to temper or heat strengthen the glass blanks to form the first and second plies 12 and 20. The presence of the high emissivity protective coating 17 also promotes more even cooling of the coated blank 80 in the cooling station 70.

To form the laminated article 10 of the invention, the coated glass ply 12 is positioned with the coated inner major surface 14 facing the substantially complimentary inner major surface 22 of the non-coated ply 20 and separated therefrom by the interlayer 18. A portion, e.g. a band of about 2 mm in width, of the coating 16 and/or protective coating 17 can be removed from around the perimeter of the first ply 12 before lamination. The ceramic band 90 can be provided on one or both of the plies 12 or 20, e.g., on the outer surface 13 of the first ply 12, to hide the non-coated peripheral edge region of the laminated sidelight and/or to provide additional shading to passengers inside the vehicle. The first ply 12, interlayer 18 and second ply 20 can be laminated together in any convenient manner, for example but not to be considered as limiting, as disclosed in U.S. Pat. Nos. 3,281,296; 3,769,133; and 5,250,146, herein incorporated by reference, to form the laminated sidelight 10 of the invention. An edge sealant 26 can be applied to the edge of the sidelight 10, as shown in FIG. 1.

Although the above method of forming the laminated sidelight 10 of the invention utilizes an RPR apparatus and method, the sidelight 10 of the instant invention may be formed with other methods, such as horizontal press bending methods disclosed, for example, in U.S. Pat. Nos. 4,661,139; 4,197,108; 4,272,274; 4,265,650; 4,508,556; 4,830,650; 3,459,526; 3,476,540; 3,527,589; and 4,579,577, the disclosures of which are herein incorporated by reference.

Figure 3:
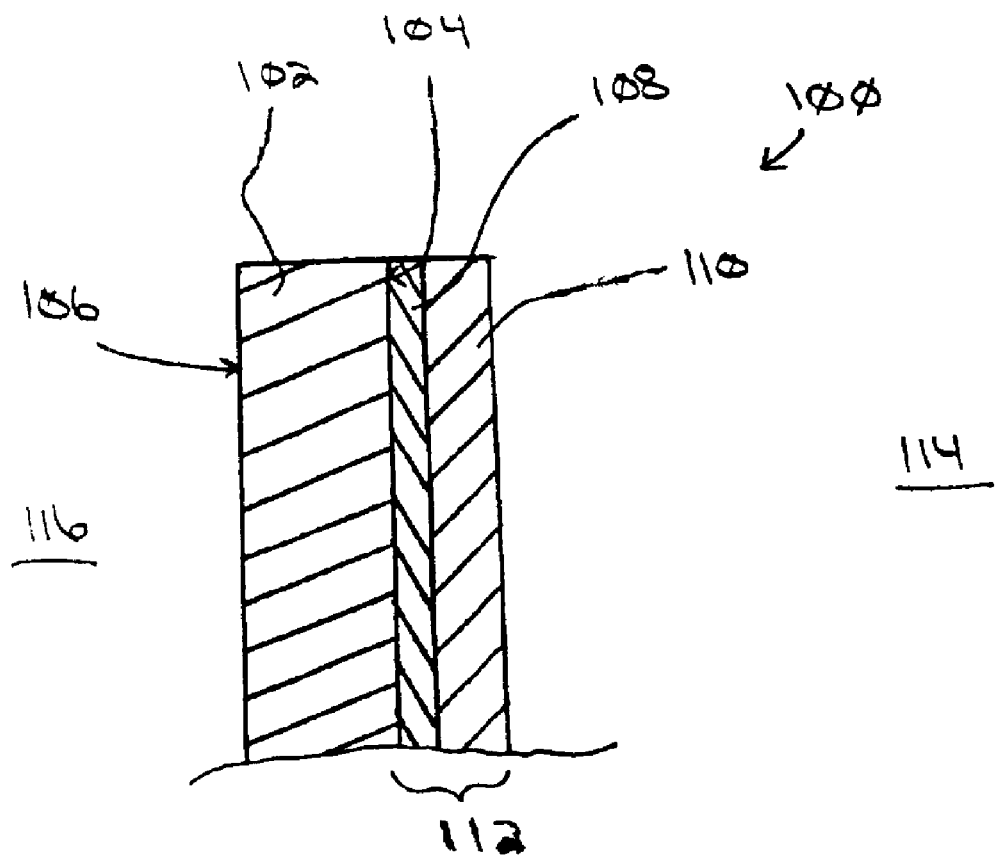
FIG. 3 is a side, sectional view (not to scale) of a portion of a monolithic article incorporating features of the invention.

FIG. 3 illustrates a monolithic article 100, in particular a monolithic automotive transparency, incorporating features of the invention. The article 100 includes a ply 102 having a first major surface 104 and a second major surface 106. A functional coating 108 is deposited over at least a portion, preferably the majority, and most preferably all, of the surface area of the first major surface 104. A protective coating 110 of the invention is deposited over at least a portion, preferably the majority, and most preferably all, of the surface area of the functional coating 108. The functional coating 108 and protective coating 110 can be deposited in any desired method, such as those described above. The functional coating 108 and protective coating 110 define a coating stack 112. The coating stack 112 may include other coating layers or films, such as but not limited to a conventional color suppression layer or a sodium ion diffusion barrier layer, just to name a few.

The ply 102 may be of any desired material, such as those described above for the plies 12, 20. For use as a monolithic automotive sidelight, the ply 102 preferably has a thickness of less than or equal to 20 mm, e.g., less than about 10 mm, such as about 2 mm to about 8 mm, e.g., about 2.6 mm to about 6 mm.

The functional coating 108 may be of any desired type or thickness, such as those described above for the functional coating 16. In one embodiment, the functional coating 108 is a solar control coating having a thickness of about 600 Å to about 2400 Å.

The protective coating 110 can be of any desired material, such as those described above for the protective coating 17. The protective coating 110 of the invention is deposited in an amount sufficient to increase, e.g., significantly increase, the emissivity of the coating stack 112 over the emissivity of just the functional coating 108 alone. For one exemplary monolithic article, the protective coating 110 can have a thickness of greater than or equal to 1 micron, such as in the range of 1 micron to 5 microns. In one embodiment, the protective coating 110 increases the emissivity of the coating stack 112 by at least a factor of 2 over the emissivity of the functional coating 108 alone (i.e., if the emissivity of the functional coating 108 is 0.05, the addition of the protective coating 110 increases the emissivity of the resultant coating stack 112 to at least 0.1). In another embodiment, the protective coating 110 increases the emissivity by at least a factor of 5, such as by a factor of 10 or more. In a further embodiment, the protective coating 110 increases the emissivity of the coating stack 112 to 0.5 or more, preferably greater than 0.6, and more preferably in the range of about 0.5 to about 0.8.

Increasing the emissivity of the coating stack 112 maintains the solar energy reflectance of the functional coating 108 (e.g., reflectance of electromagnetic energy in the range of 700 nm to 2100 nm) but decreases the thermal energy reflecting capability of the functional coating 108 (e.g., reflectance of electromagnetic energy in the range of 5000 nm to 25,000 nm). Increasing the emissivity of the functional coating 108 by deposition of the protective coating 110 also improves the heating and cooling characteristics of the coated substrate during processing, as described above in discussing the laminated article. The protective coating 110 also protects the functional coating 108 from mechanical and chemical attack during handling, storage, transport, and processing.

The protective coating 110 can have an index of refraction which is about the same as that of the ply 102 over which it is deposited. For example, if the ply 102 is glass having an index of refraction of 1.5, the protective coating 110 preferably has an index of refraction of less than 2, such as 1.3 to 1.8, e.g., 1.5±0.2.

The protective coating 110 can be of any thickness. In one monolithic embodiment, the protective coating 110 has a thickness of 1 micron or more to reduce or prevent a color variation in the appearance of the article 100. Preferably, the protective coating 110 thickness is less than 5 microns, and more preferably about 1 to about 3 microns. In one embodiment, the protective coating 110 is sufficiently thick to pass the conventional ANSI/SAE 26.1-1996 test with less than 2% gloss loss over 1000 revolutions in order to be used as an automotive transparency. The protective coating 110 need not be of uniform thickness across the surface of the functional coating 108 but may have high and low spots or areas.

The substrate with the coating stack 112 can be heated and/or shaped in any desired manner, such as that described above for heating the coated blank of the laminated article.

The monolithic article 100 is particularly useful as an automotive transparency. As used herein, the term "automotive transparency" refers to an automotive sidelight, back light, moon roof, sunroof, and the like. The "transparency" can have a visible light transmission of any desired amount, e.g., 0% to 100%. For vision areas, the visible light transmission is preferably greater than 70%. For non-vision areas, the visible light transmission can be less than 70%.

If the ply 102 with only the functional coating 108 were used as an automotive transparency, such as a sidelight, the low emissivity functional coating 108 could reduce solar energy passing into the automobile but could also promote a greenhouse effect trapping thermal energy inside the automobile. The protective coating 110 of the invention overcomes this problem by providing a coating stack 112 having a low emissivity functional coating 108 (e.g., emissivity of 0.1 or less) on one side of the coating stack 112 and a high emissivity protective coating 110 (e.g., emissivity of 0.5 or more) on the other side. The solar reflecting metal layers in the functional coating 108 reduce solar energy passing into the interior of the automobile and the high emissivity protective coating 110 reduces the greenhouse effect and permits thermal energy inside the automobile to be removed. Additionally, layer 110 (or layer 17) can be solar absorbing in one or more of the UV, IR, and/or visible regions of the electromagnetic spectrum.

With respect to FIG. 3, the article 100 can be placed in an automobile with the protective coating 110 facing a first side 114 of the automobile and the ply 102 facing a second side 116 of the automobile. If the first side 114 faces the exterior of the vehicle, the coating stack 112 will reflect solar energy due to the reflective layers present in the functional coating 108. However, due to the high emissivity, e.g., greater than 0.5, of the coating stack 112, at least some of the thermal energy will be absorbed. The higher the emissivity of the coating stack 112, the more thermal energy will be absorbed.

The protective coating 110, in addition to providing increased emissivity to the coating stack 112, also protects the less durable functional coating 108 from mechanical and chemical damage.

Alternatively, if the first side 114 faces the interior of the vehicle, the article 100 still provides solar reflectance due to the metal layers in the functional coating 108. However, the presence of the protective coating 110 reduces thermal energy reflectance by absorbing the thermal energy to prevent the thermal energy from heating the car interior to elevate its temperature and reduces the greenhouse effect. Thermal energy from the interior of the vehicle is absorbed by the protective coating 110 and is not reflected back into the interior of the vehicle.

Although particularly useful for automotive transparencies, the coating stack of the invention should not be considered as limited to automotive applications. For example, the coating stack can be incorporated into a conventional insulating glass (IG) unit, e.g., can be provided on a surface, either inner or outer surface, of one of the glass sheets forming the IG unit. If on an inner surface in the air space, the coating stack would not have to be as mechanically and/or chemically durable as it would if on an outer surface. Additionally, the coating stack could be used in a seasonably adjustable window, such as disclosed in U.S. Pat. No. 4,081,934, herein incorporated by reference. If on an outer surface of the window, the protective coating should be sufficiently thick to protect the functional coating from mechanical and/or chemical damage. The invention could also be used as a monolithic window.

Illustrating the invention are the following examples which, however, are not to be considered as limiting the invention to their details. All parts and percentages in the following examples, as well as throughout the specification are by weight unless otherwise indicated.

EXAMPLES

Several Samples of functional coatings with different protective coatings of the invention were prepared and tested for durability, scattered light haze developed after Taber abrasion, and emissivity. The functional coatings were not optimized for mechanical or optical properties but were utilized simply to illustrate the relative properties, e.g., durability, emissivity, and/or haze, of a functionally-coated substrate having a protective coating of the invention. Methods of preparing such functional coatings are described, for example but not to be considered as limiting, in U.S. Pat. Nos. 4,898,789 and 6,010,602.

Test samples were produced by overcoating different functional coatings as described below (on common soda lime clear glass) with aluminum oxide protective coatings incorporating features of the invention and having thickness in the range of 300 Å to 1.5 microns. The functional coatings used in the tests have high solar infrared reflectance and characteristic low emissivity and are comprised of multilayer interference thin films achieved by depositing alternating layers of zinc stannate and silver by magnetron sputtering vacuum deposition (MSVD). For the samples discussed below, typically two silver layers and three zinc stannate layers were present in the functional coating. Thin titanium metal primer layers are also used in the functional coatings on top of the silver layers to protect the silver layers from oxidation during MSVD deposition of the oxide zinc stannate layers and to survive heating to bend the glass substrate. The two functional coatings used in the following examples differ mainly in the outermost thin layer of the multilayer coating, one being metallic Ti and the other being oxide TiO2. Thickness of either the Ti or $TiO_2$ outer layer is in the range 10 Å to 100 Å. Alternative examples which are equally applicable but which were not prepared are functional coatings without a Ti or TiO2 outer layer or different metallic or oxide outer layers. The functional coatings used for the examples having the thin Ti outer layer have a blue reflecting color after heating and with the $TiO_2$ outer layer have a green reflecting color after heating. Other resulting reflecting colors of functional coatings after heating which can be protected with a protective coating of the invention can be achieved by changing the thickness of the individual silver and zinc stannate layers in the functional coating.

Thin or thick aluminum oxide protective coatings for the following examples were deposited by mid-frequency, bi-polar, pulsed dual magnetron reactive sputtering of Al in an Airco ILS 1600, specially modified to power two of the three targets. Power was provided by an Advanced Energy (AE) Pinnacle® Dual DC power supply and Astral® switching accessory, that converts the DC supply to a bi-polar, pulsed supply. Glass substrates with the functional coating were introduced into the Airco ILS 1600 MSVD coater having an oxygen reactive oxygen/argon atmosphere. Two aluminum cathodes were sputtered for different times to achieve the different thickness aluminum oxide coatings over the functional coatings.

Three sample coupons (Samples A–C) were prepared and evaluated as follows:

Sample A—4 inch by 4 inch (10 cm by 10 cm) pieces of 2 mm thick clear float glass commercially available from PPG Industries, Inc., of Pittsburgh, Pa.

Sample B—4 inch by 4 inch (10 cm by 10 cm) pieces of 2 mm thick clear glass coupons having an experimental low emissivity functional coating approximately 1600 Å thick with green reflecting color produced by MSVD (as described above) and no protective aluminum oxide protective coating were used as a control sample.

Sample C—4 inch by 4 inch (10 cm by 10 cm) pieces of 2 mm thick glass coupons having an experimental functional coating approximately 1600 Å thick with blue reflecting color produced by MSVD but further having a 1.53 micron thick aluminum oxide ($Al_2O_3$) protective coating of the invention deposited over the functional coating.

Figure 4:
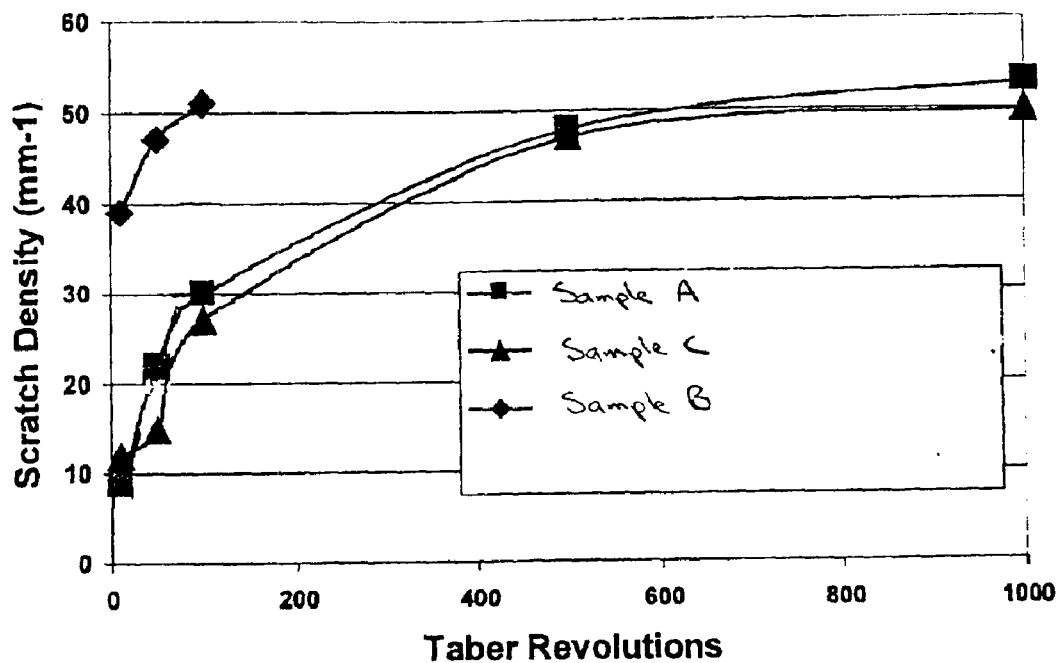
FIG. 4 is a graph showing Taber abrasion test results for substrates having a protective coating of the invention compared to substrates without the protective coating.

Replicate Samples A–C were then tested in accordance with a standard Taber Abrasion Test (ANSI/SAE 26.1-1996) and the results are shown in FIG. 4. Scratch density (SD) measurements after Taber for a given number of cycles were determined by microscope measurements of the total scratch length of all scratches in a square micron area using digitizing and image analysis software. The Sample C (protective coated) coupons showed a lower scratch density than the Sample B (functionally coated) coupons. The Sample C coupons had about the same durability as the uncoated glass coupons of Sample A. The Taber results were obtained for the "as deposited" protective coating, meaning the coated glass coupons were not post-heated after MSVD deposition of the protective coating. It is expected that the scratch density results should improve (i.e., the scratch density for few Taber cycles should decrease) upon heating of the coated substrate due to increased density of the heated coating stack. For example, the coated substrates could be heated from ambient to a maximum temperature in the range of 640° C. to 704° C. and cooled over a time period of about 10 mins to about 30 mins.

Figure 5:
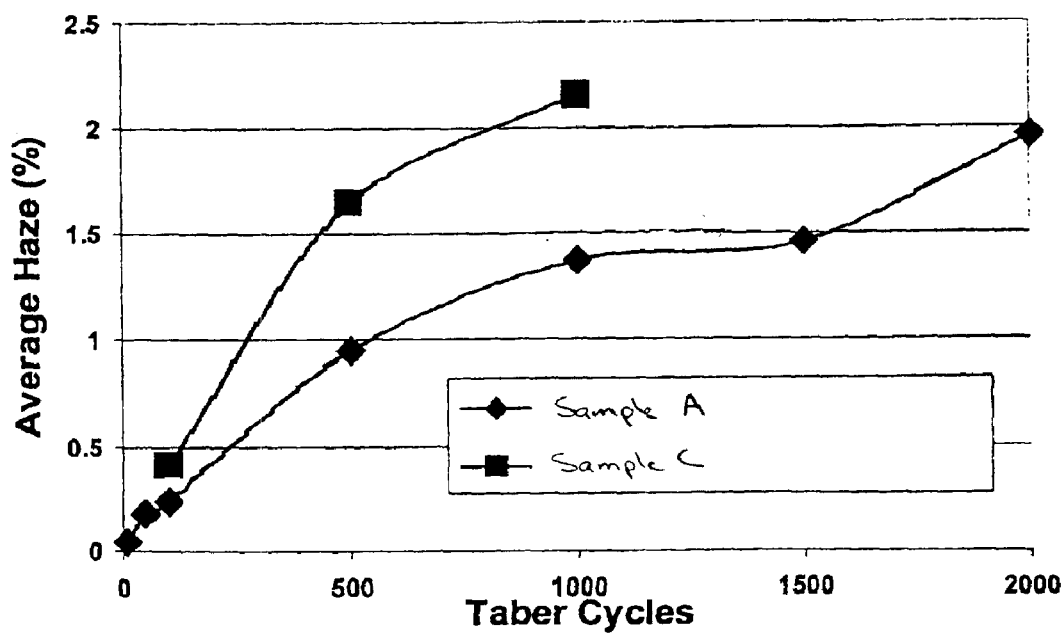
FIG. 5 is a graph of the average haze for selected substrates of FIG. 4.

FIG. 5 shows the average scattered light haze versus Taber cycles (in accordance with ANSI/SAE 26.1-1996) for replicate Samples A and C as described above. Sample A is uncoated glass used as a control. Results indicate that the haze that develops for Sample C after 1000 cycles is close to 2%, the minimum acceptable specified by ANSI for automotive glazing safety. A modest improvement in the durability of the protective coating is expected to result in less than 2% haze after 1000 Taber cycles, exceeding the ANSI safety specification for automotive glazing.

Figure 6:
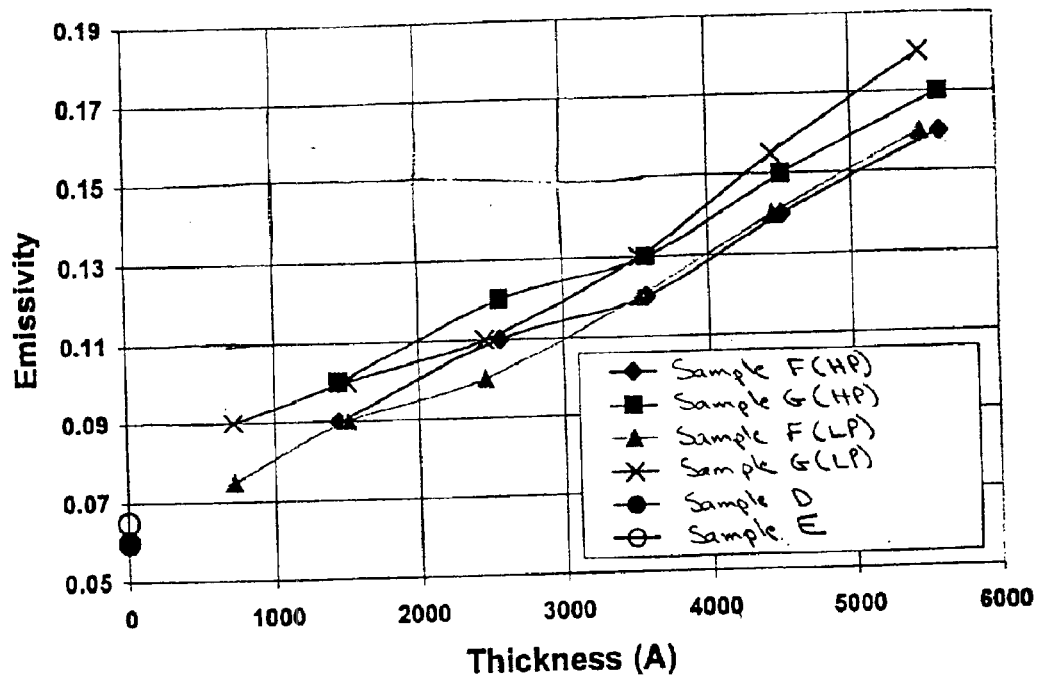
FIG. 6 is a graph of emissivity value versus coating thickness for substrates having a protective coating of the invention.

FIG. 6 shows the effect of a protective overcoat of the invention deposited at different MSVD process vacuum pressures over two different functional coatings. The Samples shown in FIG. 6 are 2 mm thick coupons of clear float glass with the following coatings deposited thereon:

Sample D—control sample; nominally 1600 Å thick blue reflecting functional coating having no protective coating.

Sample E—control sample; nominally 1600 Å thick green reflecting functional coating having no protective coating.

Sample F(HP)—the functional coating of Sample D plus an aluminum oxide protective coating sputter deposited as described above at an MSVD process vacuum pressure of 8 microns of oxygen and argon.

Sample F(LP)—the functional coating of Sample D plus an aluminum oxide protective coating sputter deposited as described above at an MSVD process vacuum pressure of 4 microns of oxygen and argon.

Sample G(HP)—the functional coating of Sample E plus an aluminum oxide protective coating sputter deposited as described above at an MSVD process vacuum pressure of 8 microns of oxygen and argon.

Sample G(LP)—the functional coating of Sample E plus an aluminum oxide protective coating sputter deposited as described above at an MSVD process vacuum pressure of 4 microns of oxygen and argon.

As shown in FIG. 6, as the thickness of the protective coating increases, the emissivity of coating stack also increases. At a protective coating thickness of about 1.5 microns, the coating stack had an emissivity of greater than about 0.5.

Figure 7:
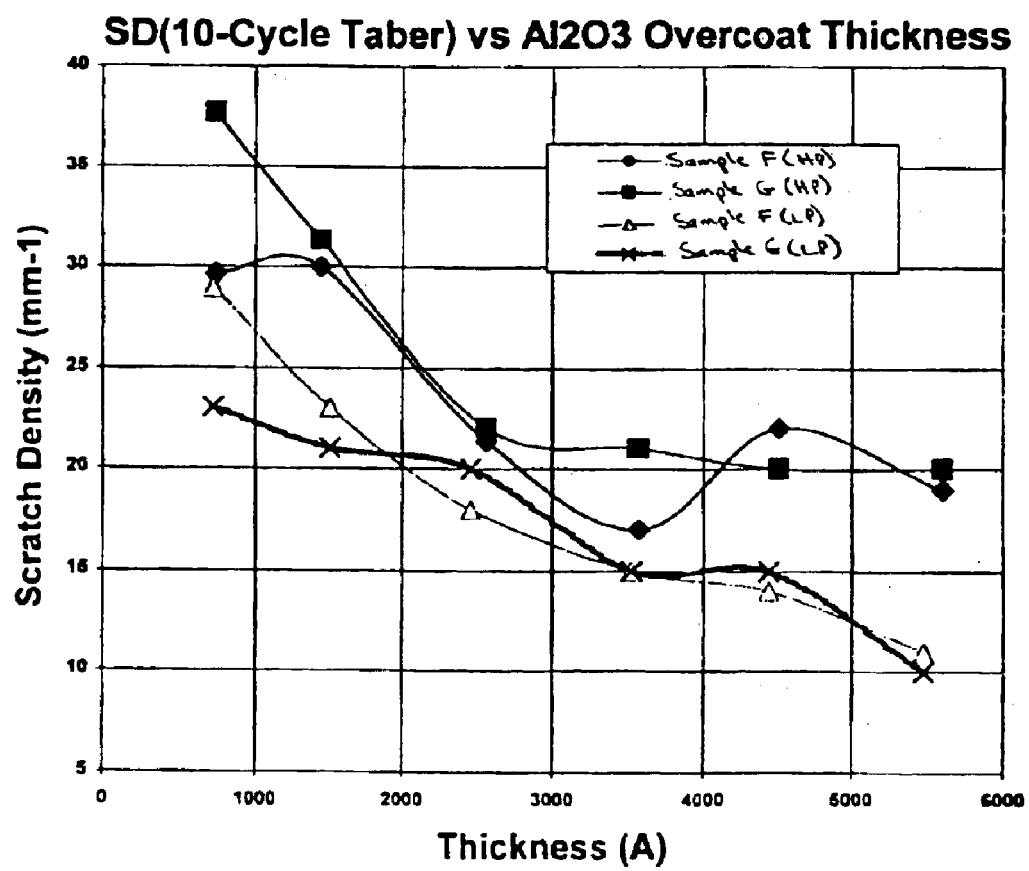
FIG. 7 is a graph showing Taber abrasion test results for substrates having a protective coating of the invention.

FIG. 7 shows the results of scratch density measurements after 10 cycles Taber abrasion for Samples F(HP), F(LP), G(HP), and G(LP) described above. The control functional Samples D and E with no protective coating had initial scratch densities on the order of about 45 $mm^{-1}$ to 50 $mm^{-1}$. As shown in FIG. 7, the application of a protective coating of the invention (even on the order of less than about 800 Å) improves the durability of the resultant coating stack.

Figure 8:
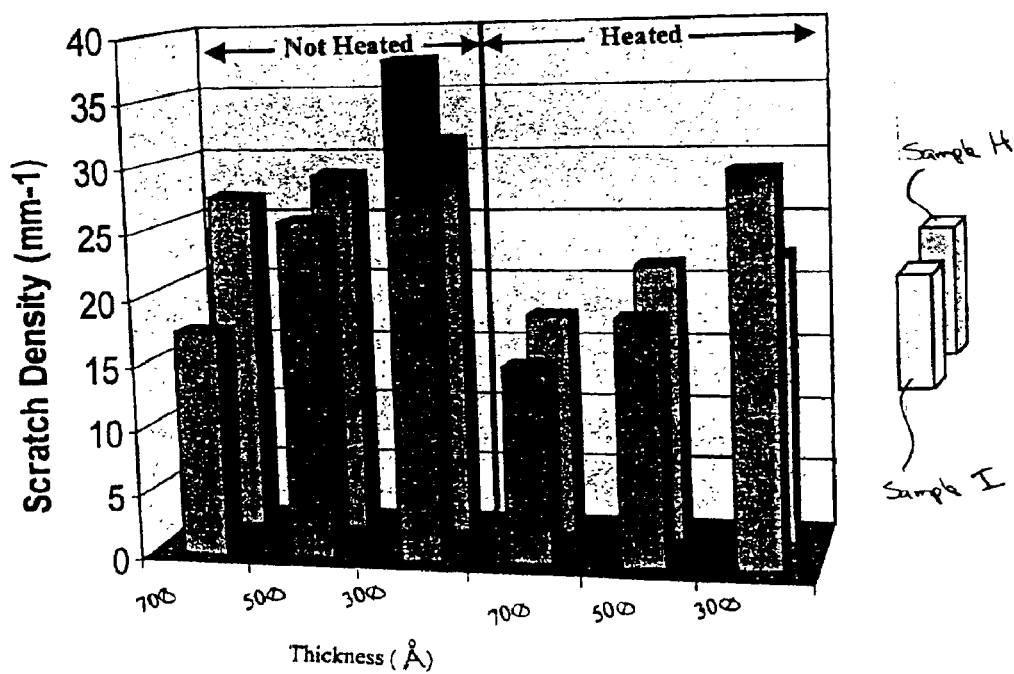
FIG. 8 is a bar graph showing the effects of heat treatment and coating thickness on Taber abrasion for coated substrates having a protective coating of the invention.

FIG. 8 shows the results of scratch density measurements after 10 cycles Taber abrasion for the following Samples of blue or green reflecting functional coatings with aluminum oxide protective coatings 300 Å, 800 Å, and 700 Å thick:

Sample H—the functional coating of Sample D plus an aluminum oxide protective coating sputter deposited as described above by MSVD.

Sample I—the functional coating of Sample E plus an aluminum oxide protective coating sputter deposited as described above by MSVD.

As shown on the right side of FIG. 8, heating the coating stack of the invention improves the durability of the coating stack. The coatings on the right side of FIG. 8 were heated by insertion in a 1300° F. oven for 3 mins, and then removed and placed in a 400° F. oven for 5 mins, after which the coated samples were removed and allowed to cool under ambient conditions.

It will be readily appreciated by those skilled in the art that modifications may be made to the invention without departing from the concepts disclosed in the foregoing description. For example, although in the preferred embodiment of the laminated article only one ply includes a functional coating, it is to be understood that the invention could also be practiced with both plies having a functional coating or one ply having a functional coating and the other ply having a non-functional coating, e.g., a photocatalytic coating. Moreover, as will be appreciated by one of ordinary skill in the art, the preferred operating parameters described above can be adjusted, if required, for different substrate materials and/or thicknesses. Accordingly, the particular embodiments described in detail herein are illustrative only and are not limiting to the scope of the invention, which is to be given the full breadth of the appended claims and any and all equivalents thereof.

What is claimed is:

1. A method of making a coated substrate, comprising:

providing a substrate having a functional coating including one or more infrared reflective films comprising a reflective metal with a first emissivity value; and depositing a coating material comprised of 35 wt. % to 100 wt. % alumina and 0 wt. % to 65 wt. % silica having a second emissivity value over at least a portion of the functional coating to provide a coating stack having an emissivity value greater than the emissivity value of the functional coating.

2. The method of claim 1, including heating the coated substrate.

3. The method of claim 1, wherein the coating material comprises 75 wt. % to 85 wt. % alumina and 15 wt. % to 25 wt. % silica.

4. The method of claim 1, wherein the coating material comprises 86 wt. % to 90 wt. % alumina and 10 wt. % to 14 wt. % silica.

5. The method of claim 1, including depositing the coating material to a thickness in the range of 100 Å to 1.5 microns.

6. The method of claim 1, wherein the coating material has an index of refraction substantially the same as the index of refraction of the substrate.

7. The method of claim 1, wherein the substrate is glass and the method includes depositing the coating material to have a thickness in the range of 100 Å to 1.5 microns and a refractive index of 1.5±0.2.

8. The method of claim 1, wherein the first emissivity value is different than the second emissivity value.

9. A method of making a coated substrate, comprising:

providing a substrate having a functional coating with a first emissivity value; and depositing a coating material comprised of 75 wt. % to 85 wt. % alumina and 15 wt. % to 25 wt. % silica having a second emissivity value over at least a portion of the functional coating to provide a coating stack having an emissivity value greater than the emissivity value of the functional coating.

10. A method of making a coated substrate, comprising:

providing a substrate having a functional coating with a first emissivity value; and depositing a coating material comprised of 86 wt. % to 90 wt. % alumina and 10 wt. % to 14 wt. % silica having a second emissivity value over at least a portion of the functional coating to provide a coating stack having an emissivity value greater than the emissivity value of the functional coating.

* * * * *